United States Patent
Rinzan

(10) Patent No.: US 11,175,323 B2
(45) Date of Patent: Nov. 16, 2021

(54) PROCESS MONITORING USING CRYSTAL WITH REACTANCE SENSOR

(71) Applicant: INFICON, Inc., East Syracuse, NY (US)

(72) Inventor: Mohamed Buhary Rinzan, Manlius, NY (US)

(73) Assignee: INFICON, INC., East Syracuse, NY (US)

(*) Notice: Subject to any disclaimer, the term of this patent is extended or adjusted under 35 U.S.C. 154(b) by 623 days.

(21) Appl. No.: 15/461,959

(22) Filed: Mar. 17, 2017

(65) Prior Publication Data

US 2018/0267086 A1    Sep. 20, 2018

(51) Int. Cl.

| | |
|---|---|
| *G01R 27/26* | (2006.01) |
| *G01F 23/26* | (2006.01) |
| *C23C 16/52* | (2006.01) |
| *C23C 14/54* | (2006.01) |
| *G01R 23/07* | (2006.01) |

(52) U.S. Cl.
CPC ........ *G01R 27/2605* (2013.01); *C23C 14/546* (2013.01); *C23C 16/52* (2013.01); *G01F 23/266* (2013.01); *G01R 23/07* (2013.01)

(58) Field of Classification Search
CPC ......... G06F 1/00; G06F 2101/00; C12Q 1/00; G01K 1/00

See application file for complete search history.

(56) References Cited

U.S. PATENT DOCUMENTS

| | | | |
|---|---|---|---|
| 6,426,635 B1 * | 7/2002 | Nussbaum | G01D 5/2405 324/658 |
| 6,459,995 B1 * | 10/2002 | Collister | G01N 27/221 702/104 |
| 7,275,436 B2 | 10/2007 | Grimshaw | |

(Continued)

OTHER PUBLICATIONS

Kato et al.; Resonance Acoustic Microbalance with Naked-Embedded Quartz (Ramne-Q) Biosensor Fabricated by Microelectromechanical-System Process; Biosensors and Bioelectronics 33 (2012) 139-145 (7 pages).

(Continued)

*Primary Examiner* — Jermele M Hollington
*Assistant Examiner* — Temilade S Rhodes-Vivour
(74) *Attorney, Agent, or Firm* — Barclay Damon LLP

(57) ABSTRACT

Devices, systems and methods for process monitoring are presented. For instance, the device includes a crystal and a reactance sensor. The crystal is connected to a frequency measurement circuit. The reactance sensor is connected to the crystal. The reactance sensor is configured to detect a change in a process parameter. The frequency measurement circuit detects the change in the process parameter as a change in the frequency of the crystal. In another example, the system includes a reactance sensor and a measurement device. The reactance sensor is disposed in a process chamber, and has a variable reactance responsive to a change in a process parameter. The measurement device is disposed outside the process chamber and has a frequency measurement circuit. The frequency measurement circuit includes a crystal and is connected to the reactance sensor, and detects the change in the process parameter as a change in the frequency of the crystal.

17 Claims, 11 Drawing Sheets

(56) References Cited

U.S. PATENT DOCUMENTS

| | | | | |
|---|---|---|---|---|
| 2001/0040154 | A1* | 11/2001 | Hashimoto | H03B 5/04 |
| | | | | 219/210 |
| 2002/0103518 | A1* | 8/2002 | Surbeck | A61N 1/40 |
| | | | | 607/101 |
| 2003/0164713 | A1* | 9/2003 | Dollinger | B60C 23/0408 |
| | | | | 324/655 |
| 2009/0051447 | A1* | 2/2009 | McCracken | H03B 5/04 |
| | | | | 331/70 |
| 2011/0154911 | A1* | 6/2011 | Ge | G01F 1/28 |
| | | | | 73/861.11 |
| 2011/0228809 | A1* | 9/2011 | Tadigadapa | G01K 7/32 |
| | | | | 374/31 |
| 2014/0031263 | A1* | 1/2014 | Norling | G01N 5/02 |
| | | | | 506/35 |
| 2014/0340098 | A1* | 11/2014 | Gogol, Jr. | G01N 29/2443 |
| | | | | 324/649 |
| 2017/0205480 | A1* | 7/2017 | George | G01R 33/34015 |
| 2017/0214381 | A1* | 7/2017 | Bhattacharjee | H03H 9/0538 |
| 2017/0228059 | A1* | 8/2017 | Chen | G06F 3/04182 |
| 2018/0107301 | A1* | 4/2018 | Kimura | G06F 3/0412 |

OTHER PUBLICATIONS

Ogi et al.; Concentration Dependence of IgG-protein A Affinity Studied by Wireless-Electrodeless QCM; Biosensors and Bioelectronics 22 (2007) 3238-3242 (5 pages).

Virgil E. Bottom, A.B., M.S., Ph.D.; Introduction to Quartz Crystal Unit Design; Van Nostrand Reinhold Electrical/Computer Science and Engineering Series; Van Nostrand Reinhold Company; 1982; ISBN 0442262019, 9780442262013; 265 pages.

Vojko Matko and Riko Safaric; Major Improvements of Quartz Crystal Pulling Sensitivity and Linearity Using Series Reactance; Sensors; Oct. 19, 2009; ISSN 1424-8220; 8 pages.

* cited by examiner

PROCESS MONITORING USING CRYSTAL WITH REACTANCE SENSOR

BACKGROUND

This application is generally directed to the field of measurement and monitoring, and more particularly to devices, systems and related methods for process monitoring using crystals, such as quartz crystals. In one example, the disclosed techniques may be used to monitor and/or control semiconductor fabrication processes.

By way of overview, the typical recipe footprint and number of installed chambers in the semiconductor industry show an increasing trend favoring atomic layer deposition (ALD) and chemical vapor deposition (CVD) technologies for semiconductor fabrication. In such techniques, the general industry practice today is to calculate the deposition-step duration using rate constants for a configuration of precursors, flow rates, pressure, plasma power, temperature, etc. These rate constants are derived from ex situ characterization of test wafers produced with the same configuration. Generally, the real rate constant is trusted to remain very close to the derived rate constant throughout the production run of a wafer lot. Problematically, CVD deposition rates can deviate from rate constants due to RF impedance change of the chamber wall, rendering these techniques inconsistent.

In one approach, quartz crystal microbalance (QCM) sensors have been integrated in CVD/ALD production chambers, but have several drawbacks. For example, a QCM sensor integrated to monitor film deposition on CVD chamber wall may fail very early during a 2-3 month long production run, rendering it useless up to the end of the run. In addition, a QCM sensor's resonance frequency is not immune to changes in pressure, temperature, and thermal shock. Hence the real frequency shift due to mass change from material addition and removal may be inseparable from the cumulative frequency shift.

In another approach, an optical sensor that is ex-situ to CVD process has been used, with limited results. Problematically, such an optical sensor may gradually lose sensitivity due to coating accumulation on the process view-port degrading the light throughput to the detector.

Replacement in either case (e.g., QCM sensor or the port window of an optical sensor) is not possible until the tool is down for preventive maintenance Such shortcomings make these sensors generally unacceptable for integration on semiconductor fabrication tools.

The same limitations noted above also are observed in the case of chamber wall cleaning, which is a required step during semiconductor fabrication. The current general practice is to program the clean time based on estimated wall accumulation thickness. Without an integrated sensor to measure the wall-deposit removal rate, it is difficult to optimize chamber cleaning. This often results in leaving deposit residuals on the chamber wall or over etching the chamber wall during each wafer cycle. Residuals left on chamber walls after each incomplete clean can gradually accumulate to form flakes. To avoid the risk of very expensive scraps that may result from particle flakes embedding into wafers full of devices, process engineers prefer an over clean strategy of the chamber walls. However, repetitive over clean steps may result in wearing of expensive chamber components, potentially turning them into permanent sources of particles.

Some processes use an optical emission spectrometer (OES sensor), preferably mounted down-stream of the process, for chamber clean end point detection. Unlike in the direct gravimetric case above, the time resolved intensity of target OES peaks are analyzed to decide the end point of cleaning. Hence the change in OES signal intensity does not correlate directly to etch rate. Also, in harsh etch environments the efficacy of the sensor depreciates faster due to unintentional coatings and damage to critical components.

A QCM sensor may be used for monitoring physical vapor deposition with sub-nanograms resolution, e.g., for optical and OLED display coatings applications. However, the quality and resolution of QCM sensors starts to degrade not only with the mass accumulation, but also with the associated intrinsic stress of the deposited film. Therefore, a production system may need more than one QCM to monitor the entire production run. For this reason, PVD chambers in OLED tools are integrated with in situ crystal exchangers that have several new QCMs stored in a carousel. This generally ensures that the expected cumulative life time of stored QCMs that perform above a set threshold is greater than the production run time. Typically, there are 10 to 12 QCMs in a carousel with only one of them electrically connected and exposed through a material aperture for deposition rate monitoring at a given time. When the performance of monitoring crystal falls below the threshold, the thickness rate monitor/controller advances a new crystal into the material aperture by activating an integrated pneumatic actuator or a stepper motor. Unlike the single-wafer PECVD chambers, the size and profile of OLED PVD chambers, which can deposit OLED material on 55" or larger glass substrates, allows space to accommodate such (larger than single QCM sensor) crystal exchangers and the atmospheric electrical feedthru bellows attached to them.

In addition, to chamber space limitations noted above, also of note is that the resonance frequency of all piezoelectric materials is dependent not only on the material accumulation, but also on temperature, pressure, thermal shock, stress, vibration, etc. In CVD, factors such as static-stress due to free expansion of film, normal stress due to pressure swings during slit valve open/close events, and thermal transients due to RF plasma ON-OFF transitions may all affect the resonance frequency of a QCM to various degrees. Hence the net frequency shift of a QCM is the algebraic sum of all above factors and there is no known method to separate out the frequency component due to mass change alone. In addition, if any of the above effects results in frequency transients, for example thermal transient due to RF plasma ON event, a slow relaxation to equilibrium frequency may mask the inference of real-time deposition or etch rate change. Hence a QCM sensor may not be suitable, especially for CVD processes that involve very thin films, as the transient relaxation time may be on the same scale or even more than the time window of the deposition/etch step. Although QCMs can be fabricated with special crystallographic orientations (by trading off performance threshold life time) to increase immunity to any one of the above effects, there is none available to suppress all sensitivities simultaneously.

Further, for many PECVD processes, the temperature of the substrate pedestal is maintained around 200-300 C while the chamber wall temperature is maintained around 70-150 C. However, many thermal CVD reactors operate at temperatures close to the α-β phase transition point (~550 C) of crystalline Quartz. Although, micro-balances similar to QCM made from other piezoelectric materials such as Gallium Orthophosphate, Lanthanum Gallium Silicate, etc. can operate at higher temperatures, they are too expensive to be an expendable part of a sensor. Regardless, microbalances made from these piezoelectric materials, such as quartz, can be designed to have different temperature cuts with a low temperature coefficient of frequency over a narrow window. This requires process-specific microbalance variants available to match the operation temperature in the process environment. However, temperature swings outside the specified window, for example caused by exothermic reaction steps, may result in intolerable rate offsets, cloaking the real rate. This requires a thermocouple, a heater, and a cooling-reservoir, along with the associated electrical connections, be integrated with the sensor, creating design complexity and increasing the cost. Nevertheless, the overall size of such a complex sensor may not be compatible with small ports and flange tunnels that are available on a typical current CVD production chambers.

In addition, unlike the line-of-sight deposition in PVD, the gas-phase reactions of CVD make the back face of a QCM vulnerable to unintentional mass accumulation, giving rise to inflated thickness correlation. To prevent precursors from reaching the back, QCMs can be sealed or a slow inert gas purge can be maintained over the back face of it. Both these strategies increase design complexity and make crystal replacement cumbersome, especially in a production environment. Although there is low outgassing epoxy available, typical CVD process temperature may excite outgassing in the process chamber. Because of above reasons, a sensor with such an arrangement may not be practical for a production tool.

Non-QCM solutions such as ellipsometry, and indirect rate monitoring methods such as electron-impact-emission spectroscopy and atomic absorption spectroscopy are optical methods where either the sensor or both the sensor and source are mounted outside the chamber. These solutions, however, rely on clean view-through ports on the chamber. Some PVD applications can use these methods as the evaporant flux does not scatter much to coat material on optical windows. However, it is not practical for CVD processes as material accumulation on view-through ports degrades the light throughput to the detector of these sensors.

Therefore, a need exists for an alternative sensor having an effective life exceeding the typical average tool up-time, which is more immune to changes in process parameters such as pressure, gas flow, etc.

SUMMARY

Devices, systems and methods for process monitoring are presented. For instance, a device includes a crystal and a reactance sensor. The crystal is connected to a frequency measurement circuit. The reactance sensor is connected to the crystal. The reactance sensor is configured to detect a change in a process parameter. The frequency measurement circuit detects the change in the process parameter as a change in the frequency of the crystal.

In another aspect, a system includes a reactance sensor and a measurement device. The reactance sensor is disposed in a process chamber, and has a variable reactance responsive to a change in a process parameter. The measurement device is disposed outside the process chamber and has a frequency measurement circuit. The frequency measurement circuit includes a crystal and is connected to the reactance sensor. The frequency measurement circuit detects the change in the process parameter as a change in the frequency of the crystal.

In a further aspect, a method is presented. A reactance of a process within a process chamber is monitored with a reactance sensor. The reactance sensor includes a variable reactance responsive to a change in a process parameter. A crystal disposed outside the process chamber is connected to the reactance sensor. A change in the frequency of the crystal is detected. The detected change in the frequency of the crystal is used to determine the process parameter.

An advantage that may be realized in the practice of some disclosed embodiments of the device is the provision of a process parameter tracking circuit based on the principle of tracking the resonance mode pulling affected through the process parameter. Another advantage is the provision of a real-time high resolution reactance-change tracking circuit to track small capacitance changes of an attached sensor. A further advantage is a mode-hopping free phase-locked measurement circuit to track frequency pulling of a particular mode. An additional advantage is the ability for non-gravimetric rate monitoring of a deposition process where the quartz crystal of the circuit is not directly exposed to the process. Another advantage is practical deposition rate monitoring (e.g., for monitoring sequential deposition and/or etch of materials) in CVD and ALD processes. A further advantage is the ability to monitor cleaning of chamber wall residuals.

BRIEF DESCRIPTION OF THE DRAWINGS

So that the manner in which the features of the invention can be understood, a detailed description of the invention may be had by reference to certain embodiments, some of which are illustrated in the accompanying drawings. It is to be noted, however, that the drawings illustrate only certain embodiments of this invention and are therefore not to be considered limiting of its scope, for the scope of the disclosed subject matter encompasses other embodiments as well. The drawings are not necessarily to scale, emphasis generally being placed upon illustrating the features of certain embodiments of the invention. In the drawings, like numerals are used to indicate like parts throughout the various views.

DETAILED DESCRIPTION

Figure 1:
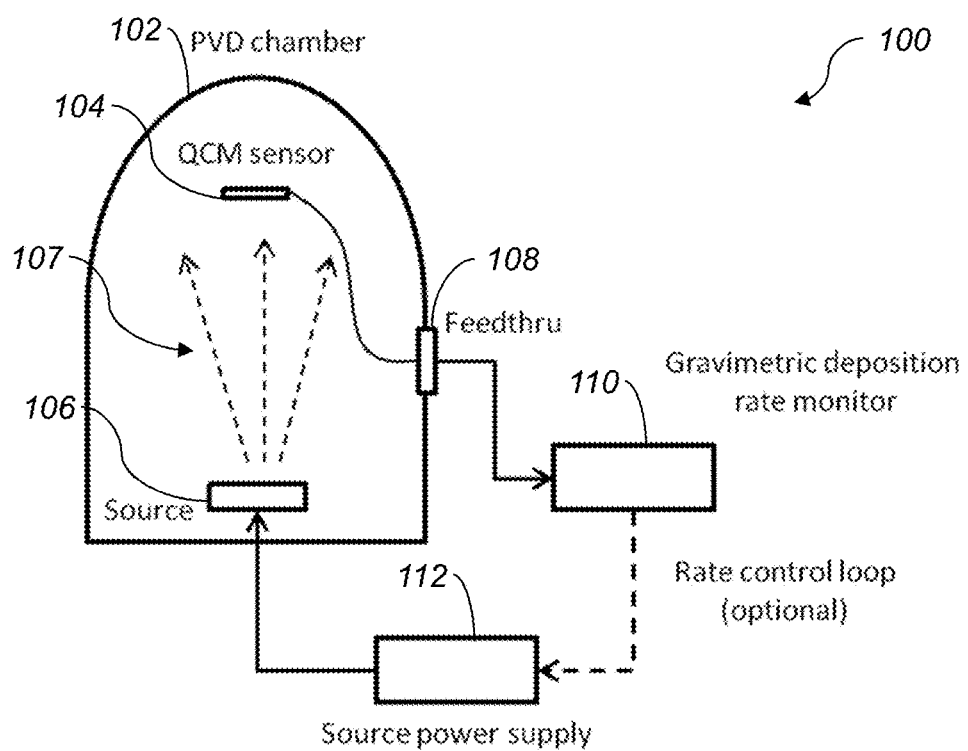
FIG. 1 depicts a quartz crystal used as a gravimetric sensor for measuring a thin film deposition rate in a typical vacuum evaporation application, in accordance with aspects set forth herein.

Embodiments of the disclosed subject matter provide techniques for process monitoring using crystals with reactance sensors, such as quartz crystals with capacitance sensors. Other embodiments are within the scope of the disclosed subject matter.

The present disclosure provides, in part, a novel circuit to measure a capacitance change, or more generally a reactance change in a reactive element, which may be used as a sensor. The simple and elegant circuit can be coupled to a capacitance or reactance sensor exposed to a process to measure the real time change of a process parameter. The measurement principle includes the tracking of the magnitude of resonance pulling by the change to the sensor capacitance through the process parameter.

The pulling sensitivity of the selected resonance mode of a quartz crystal can be moderately linearized for small capacitance loads by pinning the mode's anti-resonance pole. This may be achieved by compensating the reactance due to crystal's static capacitance through a matching series inductor. The pulling sensitivity is also shown to increase with decreasing static capacitance of the crystal. Such enhancement to pulling sensitivity comes at a trade-off to crystal's loaded quality factor. However, further depreciation of the crystal's quality during process monitoring is minimal.

In one example, the dynamic range of a process parameter of interest can be translated to a corresponding capacitance dynamic range, for example on the order of pico-farad with sub femto-farad resolution.

In another example, the devices allow for high resolution measurements of small capacitance changes of a capacitance sensor induced by the physical quantity of interest of a process. Currently, there are several different types of capacitance meters such as LCR meters and impedance analyzers available. The high end ones employ a bridge-based capacitance measurement where a reference capacitor is changed to obtain bridge balance generally at excitation frequencies around 100 Hz to 1 kHz. These bridge based capacitance meters can measure capacitance values down to pico-farad range. Ultra-sensitive bench-top capacitance meters such as those available from Andeen-Hagerling, Inc., of Cleveland, Ohio, USA, can measure down to atto-farad. All of these instruments are bulky, costly, and complex, and it is difficult to integrate with pertinent sensors for process monitoring.

In one example, a change in a process parameter of interest can change the capacitance of a sensor connected to a quartz crystal to induce a relatable frequency pulling. As explained below, an enhanced phase-locked loop type circuit can be used to track the frequency pulling on a quartz crystal. In such a manner, a device can track the change in the magnitude of a process parameter. Advantageously, such a device provides a circuit for real-time high resolution measurement of small capacitance or a small inductor. The speed and measurement resolution of the circuit benefits applications that allow integration of a simple sensor either in the form of a capacitor or an inductor to monitor a process. The benefits of using a quartz crystal in a manner that it is not exposed to the process being monitored are illuminated by describing the shortcomings when it is directly exposed to the process, as noted above. For example, the impracticality to use the quartz crystal sensor as a gravimetric sensor, namely Quartz Crystal Microbalance (QCM), is noted with regards to potential applications. It is emphasized that this example does not preclude the benefits of the disclosure in other relevant applications.

Advantageously, the present disclosure enables real-time monitoring to allow controlling the rate of growth in a deposition process within a tolerance of the recipe rate constants through active correction to pertinent recipe variables. Additionally, this will also provide the additional benefit of detecting excursions due to unexpected events such as precursor run-out, instrument malfunction etc. Further, the disclosed techniques may also reduce the number of test-wafer runs required and the associated wait time for metrology tool, leading to optimization of production wafer throughput.

Generally stated, provided herein, in one aspect, is a device for process monitoring. For instance, the device includes a crystal and a reactance sensor. The crystal is connected to a frequency measurement circuit. The reactance sensor is connected to the crystal. The reactance sensor is configured to detect a change in a process parameter. The frequency measurement circuit detects the change in the process parameter as a change in the frequency of the crystal.

In one embodiment, the frequency measurement circuit includes a phase lock circuit. In another embodiment, the frequency measurement circuit measures a fundamental and an inharmonic mode of the crystal. In a further embodiment, an inductor is connected in series with the crystal. In one example, a varactor circuit is connected to the crystal. In such a case, the varactor circuit may be configured to improve a linearity of a response to the reactance sensor. In another example, the frequency measurement circuit includes a mode-locking circuit to inhibit mode hopping of the crystal. In further examples, the reactance sensor may monitors a liquid level and/or a pressure level.

In another aspect, a system includes a reactance sensor and a measurement device. The reactance sensor is disposed in a process chamber, and has a variable reactance responsive to a change in a process parameter. The measurement device is disposed outside the process chamber and has a frequency measurement circuit. The frequency measurement circuit includes a crystal and is connected to the reactance sensor. The frequency measurement circuit detects the change in the process parameter as a change in the frequency of the crystal.

In a further aspect, a method is presented. A reactance of a process within a process chamber is monitored with a reactance sensor. The reactance sensor includes a variable reactance responsive to a change in a process parameter. A crystal disposed outside the process chamber is connected to the reactance sensor. A change in the frequency of the crystal is detected. The detected change in the frequency of the crystal is used to determine the process parameter.

FIG. 1 depicts a measurement system 100 in which a quartz crystal is used as a gravimetric QCM sensor 104 for measuring thin film deposition rate in a process chamber 102, in a typical vacuum evaporation application. In the example of FIG. 1, a source 106 is used to deposit a material 107 with the chamber 102. The QCM sensor 104 sends signals through a feedthru 108 to a gravimetric deposition rate monitor 110. A feedback control loop may be used to control the deposition rate by modulating the source power supply 112, in that the deposition rate information can be optionally used to generate a voltage signal to control the deposition rate, either manually or in a feed-back control loop.

By way of overview, quartz crystals are used as an active circuit element to generate oscillation to track the fundamental resonance mode of the crystal. In such a case, oscillation is triggered and sustained at a frequency matching the series resonance mode with the lowest impedance of all modes permissible. Hence it is a sufficient circuit to measure fundamental modes of crystal resonance provided the mode impedance remains the minimum of all modes. However, when there are several modes with comparable impedance present, such a circuit is prone to mode hopping, more so in the case of an inductive element connected to a crystal.

In the configuration of FIG. 1, the quartz crystal, e.g., the QCM sensor 104, is exposed to the process chamber 102, and the quality depreciates gradually during the process monitoring because of such exposure.

Figure 2:
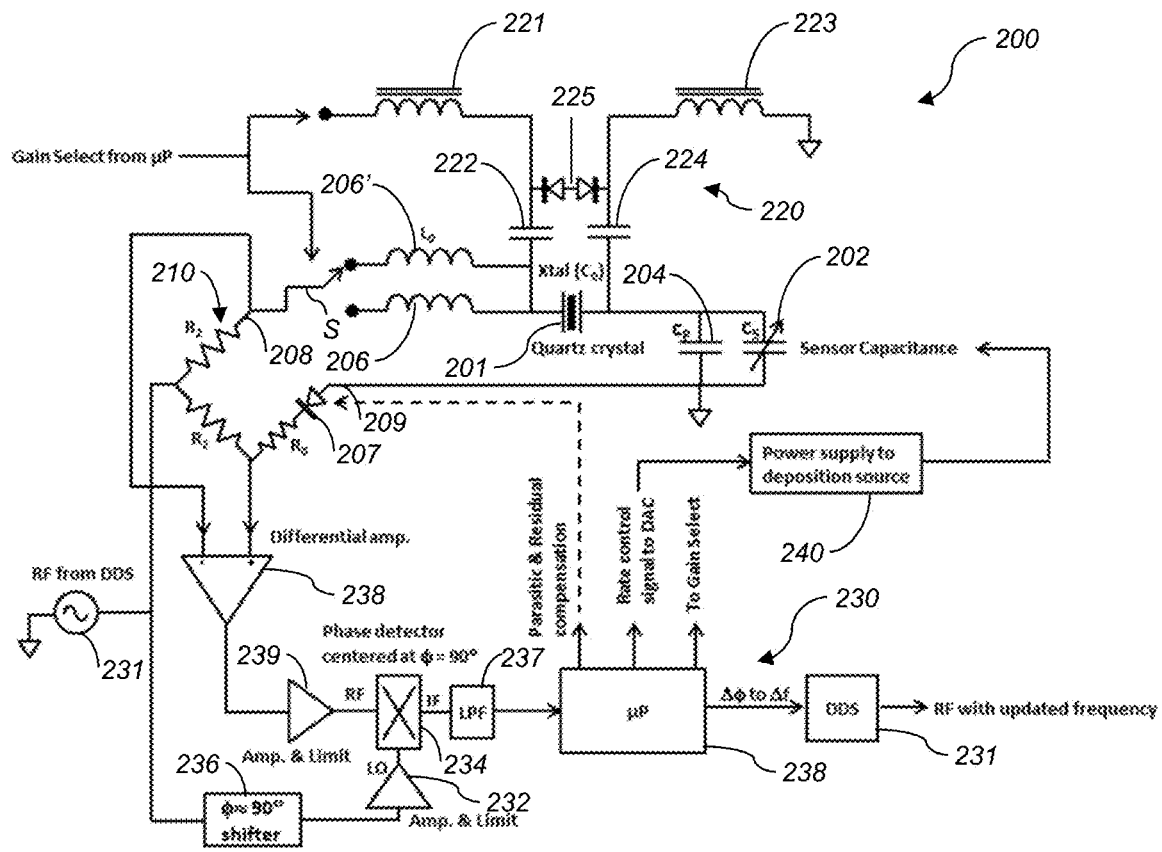
FIG. 2 depicts an auto phase-locked reactance measurement circuit, in accordance with aspects set forth herein.

FIG. 2 depicts an auto phase-locked reactance measurement circuit 200, in which a crystal 201 and a sensor 202 along with a matching inductor 206, 206' forms a measurement or sensor arm 208 of a reactance bridge 210 and a reference or compensation arm 209 includes a varactor diode 207 to offset the starting capacitance, including any parasitic reactance at the beginning of a process monitoring. The circuit 200 tracks frequency pulling of crystal 201.

By way of overview, the circuit 200 includes a measurement or reactance bridge 210, which has a measurement or sensor arm 208 and a reference or compensation arm 209, an elliptic filter 220, and phase lock circuitry 230, each described in detail below. Regardless of the magnitude of mode-impedances of the crystal 201, this circuit 200 insures reliable tracking of any selected mode. The crystal 201 is connected in series with a reactance sensor, such as a capacitance sensor 202, and an inductor 206 or an inductor 206' thereby forming the sensor arm 208 as shown. The value of the inductor 206, 206' is chosen to pin the anti-resonance pole of the fundamental mode during frequency pulling. The pulling sensitivity can be selected by a switch S between, for example, a low inductor 206 and high inductor 206', and the pulling can be linearized actively.

A direct digital synthesizer (DDS) 210 and an elliptic filter 220 complete the crystal drive circuit 200. In another embodiment, the elliptic filter 220 may include a temperature controlled crystal oscillator (TCXO). The elliptic filter 220 includes inductors 221, 223, capacitors 222, 224, and diodes 225. The number of nodes and filter parameters (e.g., capacitances and inductances of the elliptic filter 220) are designed to optimize the stop-band attenuation. The radio frequency (RF) from the direct digital synthesizer 231 is branched to the crystal reactance bridge 210 and to the local oscillator (LO) input 232 of a mixer 234. The LO input 232 is phase shifted by 90° by a shifter 236 to obtain a zero IF current for in-phase input condition. A doubly balanced bridge 238 is selected for the mixer 234 to minimize DC offset; hence, to match the drive frequency at the true pulled frequency of the crystal 201. Also, the mixer 234 is biased close to compression to obtain a constant phase slope for a selected frequency pulling range. The mixer 234 feeds into a low pass filter 237. The overall circuit is controlled by a microprocessor 238, which takes care of parasitic and residual compensation, rate control signaling to a digital to analog converter (DAC) and gain selection of the circuit 200. The reference arm 209 of the bridge 210 is used to compensate the residual reactance of the sensor 202. This compensation is realized at a frequency outside the resonance and is achieved by adjusting the voltage to a varicap 207 of the reference arm.

In one example, the capacitance sensor is disposed in a deposition process chamber, and a deposition source power supply 240 may be connected to the circuit 200, so that the circuit 200 may use the measurements to control the deposition process, to achieve a desired deposition thickness.

In another embodiment, a combination of the features described in FIGS. 1 and 2 may be employed in a hybrid system, in which a first quartz crystal sensor, e.g., as depicted in FIG. 1, is located inside a process chamber and a second quartz crystal sensor, e.g., as depicted in FIG. 2, is located outside a process chamber. In such a case, the combination of sensor output from both quartz crystal detectors can be used to establish corrections to and improve the detection resolution, allowing benefits of both deployments to be realized in a single device, system, or circuit.

Figure 3:
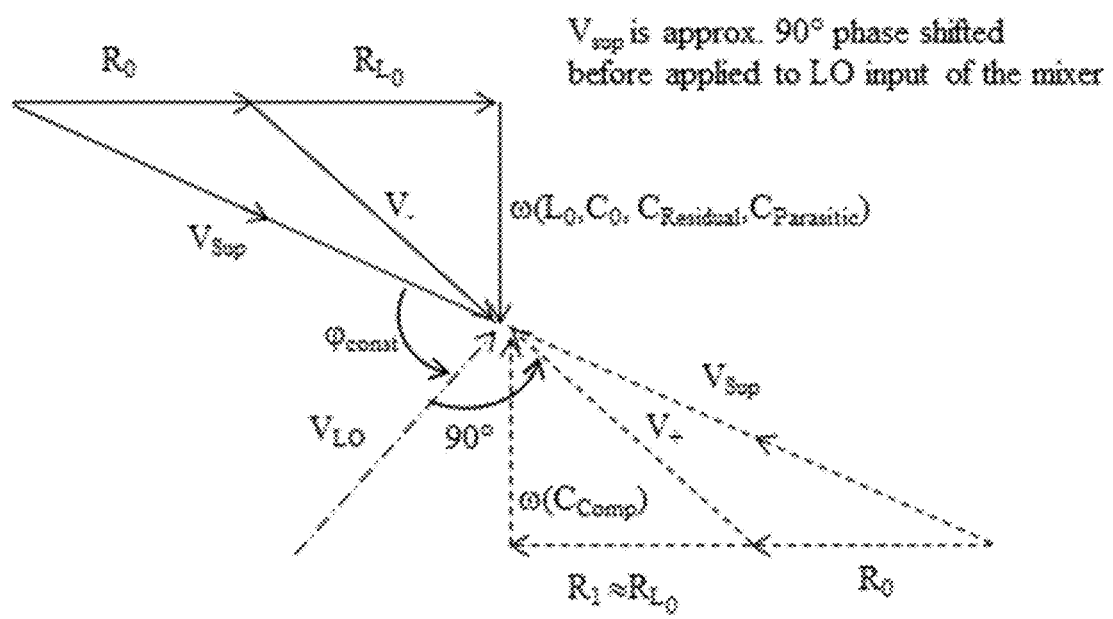
FIG. 3 depicts phasor diagrams for the measurement and compensation arms at phase-lock condition, in accordance with aspects set forth herein.

FIG. 3 depicts phasor diagrams for the measurement and compensation arms at phase-lock condition, and shows the phasor diagram at bridge balance of the measurement bridge 210 (FIG. 2). Any change in the sensor capacitance causes a bridge imbalance. This generates a phase error signal which then triggers the drive frequency to change in such direction to insure phase-lock. A process monitoring starts with the compensation mentioned above followed by locating the fundamental mode or any other mode of interest. The circuit 200 (FIG. 2) sweeps the DDS frequency to locate the frequency pulled mode of interest. A sharp trending down and zero-crossing of the phase error terminates the sweep, matching the drive frequency to the pulled resonance of a mode. During process monitoring, any change in the process parameter (e.g., of sensor 202) pulls the resonance modes of the impedance spectrum, generating a proportional phase error. This prompts the control loop to change the drive frequency in steps that are proportional to the magnitude of residual phase error until the error converges to zero, indicating the magnitude of frequency pulling.

Accordingly, the circuit tracks the frequency pulling and the process parameter being monitored. The phase-lock feedback insures fast and continuous measurements that are immune to mode hopping. The rate of change of the phase error depends on the rate of process change and the gain of phase slope depends on the pulling sensitivity and the loop gain. The capacitance dynamic range of the sensor attached to the circuit is mainly defined by the loop gain of phase-lock and the capacitance resolution is defined by the frequency resolution of the DDS. Optionally, as shown in FIG. 2, the pulling rate can be used to generate a voltage signal to control the process about a set point.

Figure 4:
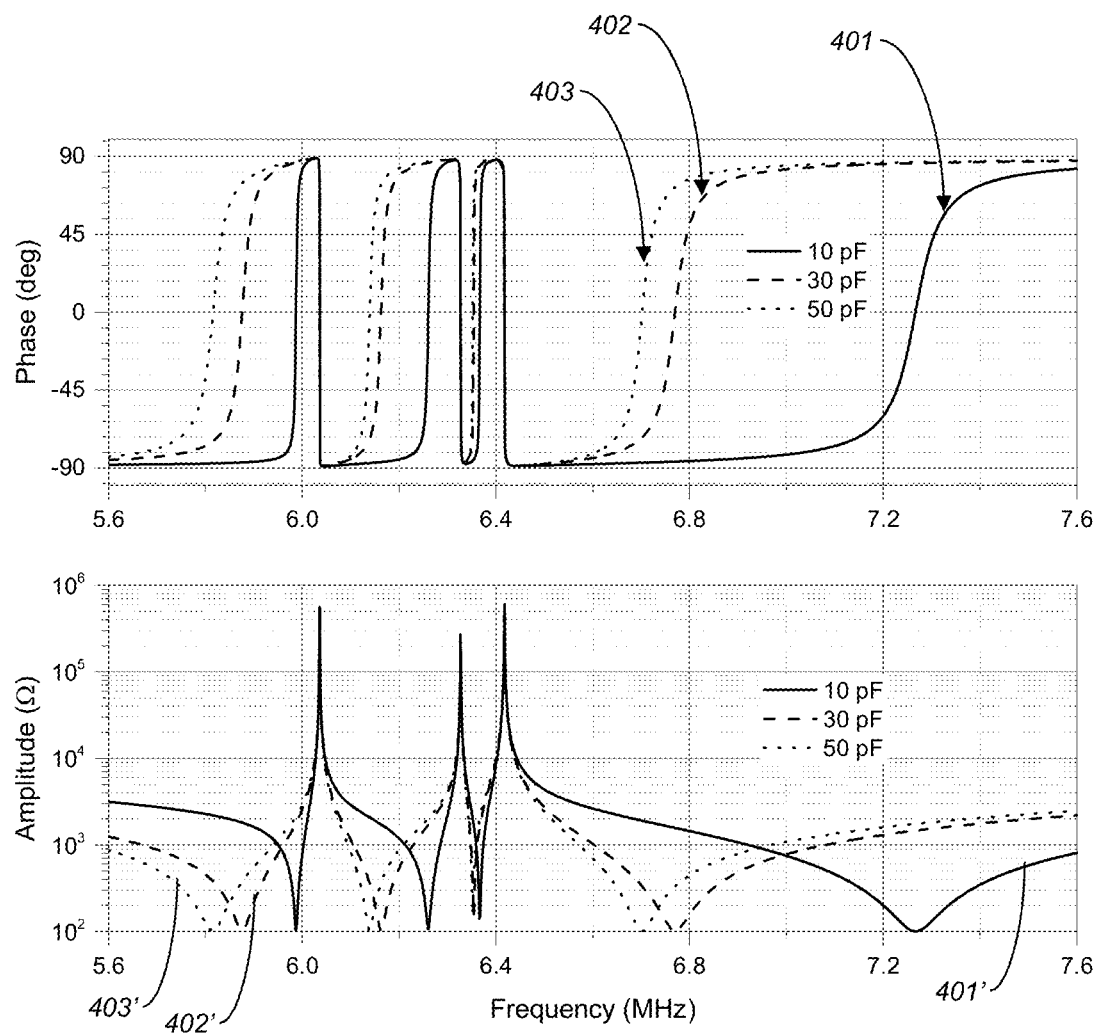
FIG. 4 depicts the impedance vs. frequency of the sensor arm of the circuit shown in FIG. 2, in accordance with aspects set forth herein.

FIG. 4 depicts the impedance vs. frequency of the sensor arm 208 of the circuit 200 (FIG. 2) for a specific configuration of the reactance bridge 210. The amplitude and phase plot depicts series and parallel resonance curves 401-403 of the fundamental mode and the two nearest spurious modes. Curve 401 corresponds to a capacitance of 10 picofarads (pF), curve 402 corresponds to a capacitance of 30 pF, and curve 403 corresponds to a capacitance of 30 pF. The series resonance frequency of the modes shifts down as the sensor capacitance increases. The broad low-Q resonance to the right of these modes is due to the matching inductance. In this example, the crystal selected has a static capacitance of 6.4 pF and its fundamental resonance mode (or the mode of interest) without intentional pulling was located ~5.94 MHz. Continuing with this example, a high quality inductor, L=175 µH, was connected in series to pin the anti-resonance pole of the mode of interest. The figure shows the pulling of all modes as a function of the sensor capacitance. The two nearest inharmonic modes and the non-crystal resonance mode resulting from the added inductor are also shown in FIG. 4. For a designed static capacitance of a crystal, the gain of pulling sensitivity needs to be limited to keep the inductance mode sufficiently separated from the mode of interest.

The sensor arm configuration used in FIG. 2 can also be used in an active oscillator circuit. However, the multiple resonances shown in FIG. 4 may cause mode-hopping between the fundamental and the other modes. Especially, when an inductor is used in series with the crystal, the magnitude of impedance at resonance modes is limited by the sheet resistance of the inductor. This results in indistinguishable resonance modes for an active oscillator circuits. As shown in the phase plot of FIG. 4, pinning the anti-resonance pole of the fundamental mode near the unloaded resonance insures increasing node-pole separation with increasing sensor capacitance. However, in the conventional use of crystals as gravimetric sensors, the node-pole separation decreases as a function of accumulated mass. Therefore, the current disclosure brings benefits to applications where the loaded Q decreases rapidly if the crystal needs to be directly exposed to process.

Figure 5:
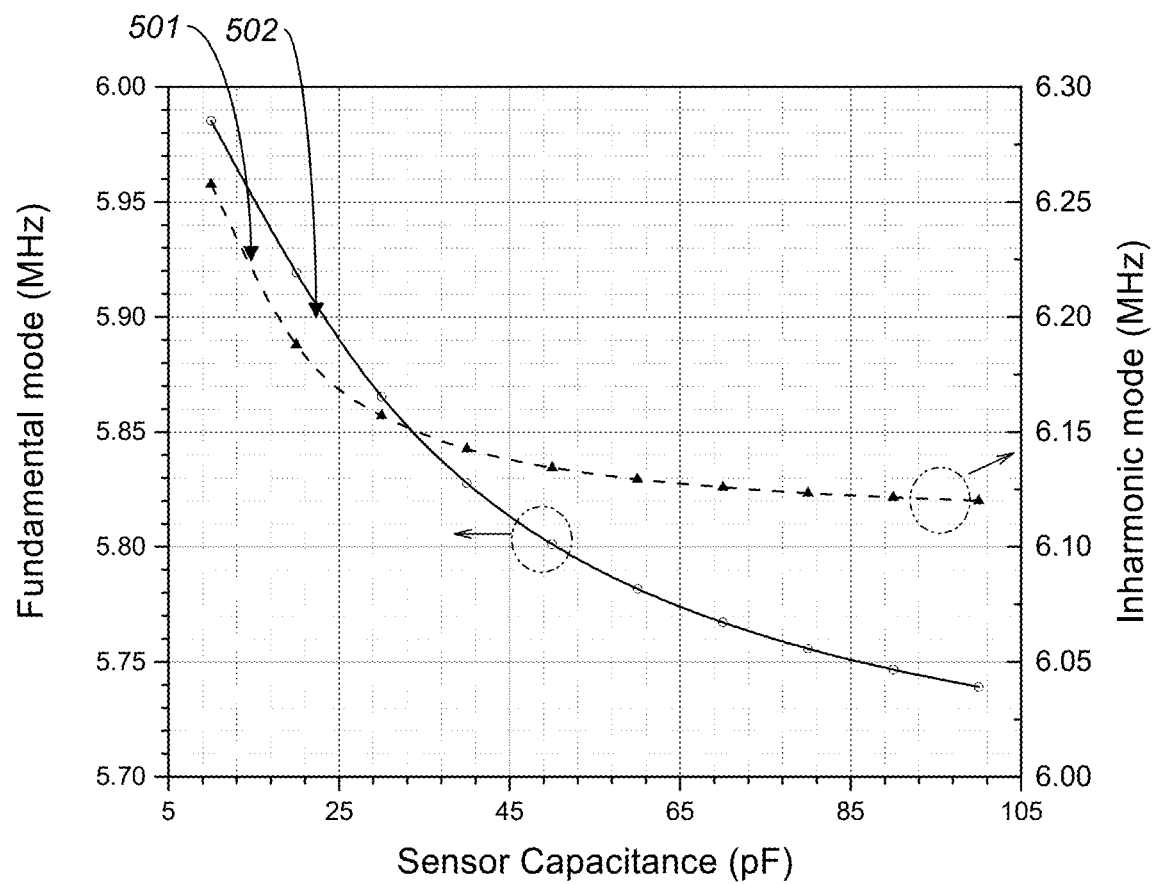
FIG. 5 depicts the series resonance of the fundamental and the first spurious modes as a function of sensor (or load) capacitance, in accordance with aspects set forth herein.

FIG. 5 depicts the series resonance of the fundamental mode 502 and the first spurious inharmonic mode 501 as a function of sensor (or load) capacitance. The crystal selected has a fundamental resonance node at 6 MHz. The (low frequency) static capacitance of the crystal is ~4.1 pF, and the inductance matched to pin the first anti-resonance pole is ~170 µH. The inductance selected was matched to increase the pulling sensitivity of the fundamental mode. The fundamental resonance is pulled over 250 kHz for a capacitance change of ~100 pF. The circuit has a frequency resolution of 3.5 mHz, which translates to a mean capacitance resolution of ~2 aF spread over the range from 5 to 100 pF. In the region from 5-35 pF, the capacitance resolution is even higher and is around 0.7 aF. In order to benefit from the high resolution, the crystal needs to be designed with an intentional temperature coefficient that is equal in magnitude and opposite in sign to the apparent temperature coefficient due to pulling in the capacitance region of interest. Alternatively, the crystal's temperature can be maintained close to its turning point.

Figure 6A:
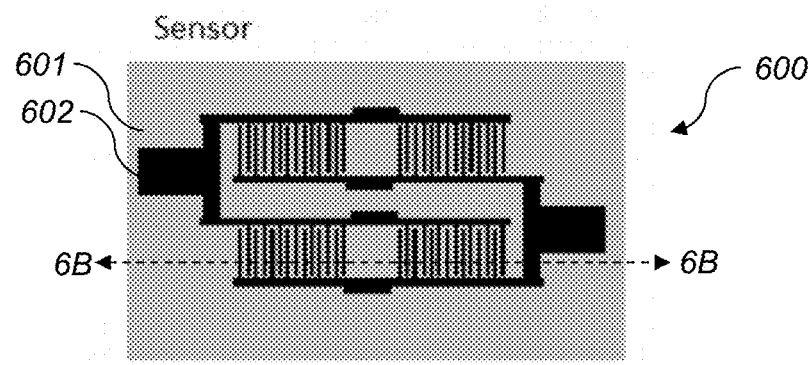
FIGS. 6A-6C depicts an embodiment of the sensor component of the circuit, in accordance with aspects set forth herein.
Figure 6B:
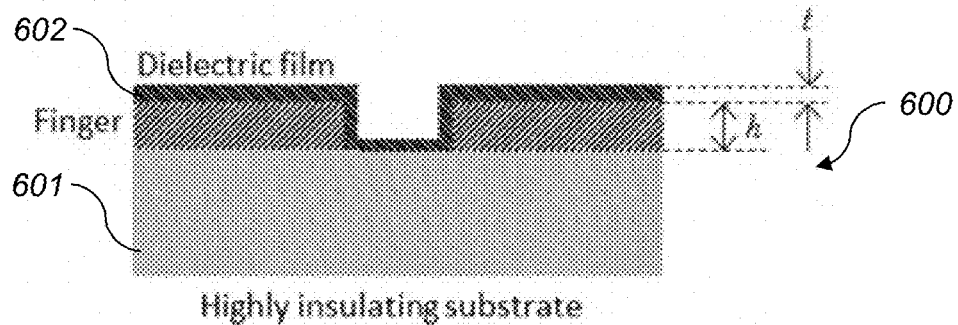
Figure 6C:
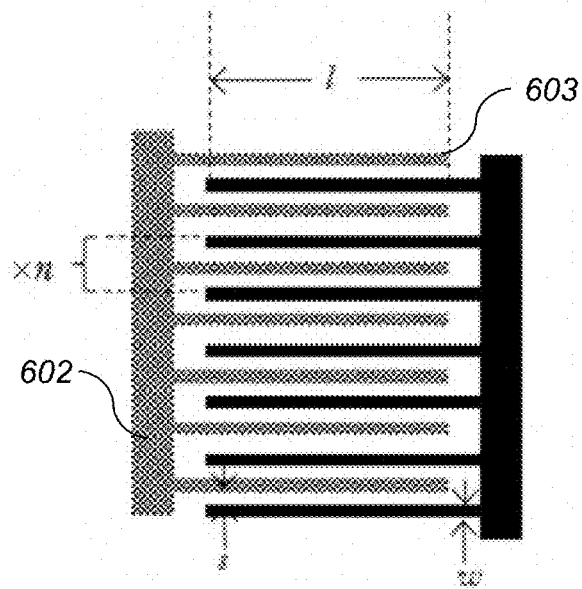

FIGS. 6A-6C depict a capacitive sensor 600, e.g., an embodiment of sensor 202 of the circuit 200 (FIG. 2). FIG. 6A depicts a plan view of the sensor 600, FIG. 6B depicts a cross sectional elevational view of the sensor 600 taken along line 6B-6B of FIG. 6A, and FIG. 6C depicts a detailed view of the sensor 600. Sensor 600 includes planar interdigitated fingers 603 (e.g., electrodes) fabricated on, e.g., a highly insulating, substrate 601. The sensor 600 monitors the growth of a dielectric film 602, as depicted in FIG. 6A. The transverse field due to drive signal penetrates the dielectric film 602 in the gap between the fingers 603 and the contribution to total capacitance depends on the dielectric constants of the film 602 and the insulating substrate 601. The component due to fringing capacitance between the interdigitated fingers 603 depends on the metal to gap ratio of the fingers 603, and according to simulation results it does not change much with the film growth. Therefore, the capacitance change of the interdigitated fingers 603 can be used to monitor the deposition rate of dielectric films 602. The finger height of the sensor 600 may be designed to match the thick film case and at least twice as tall as the maximum film thickness intended to be measured. In order to limit the worst case noise floor to ~200 mHz, the interdigitated sensor 600, or a sensor in any other form, may be designed so that the maximum of the process parameter relates to a capacitance of approximately 100 pF. Similar to the above sensor, if the film growth rate of metals needs to be measured, the capacitance sensor 600 can be replaced with an inductance sensor where the thickness of the metal changes the self-inductance of the sensor. In such a case, the inductive sensor also influences the frequency pulling of the crystal, and allows for detection.

Such a sensor 600 may be used to monitor deposition rate. For a unity width to height ratio of fingers 603, the sensor life may be defined as the time it takes for the film thickness of any material or any combination of materials to grow to half the height of fingers under conformal coating condition and unity rate. In another example, sensor 600 includes a sensor-die with four interdigitated plates connected in parallel.

Figure 7:
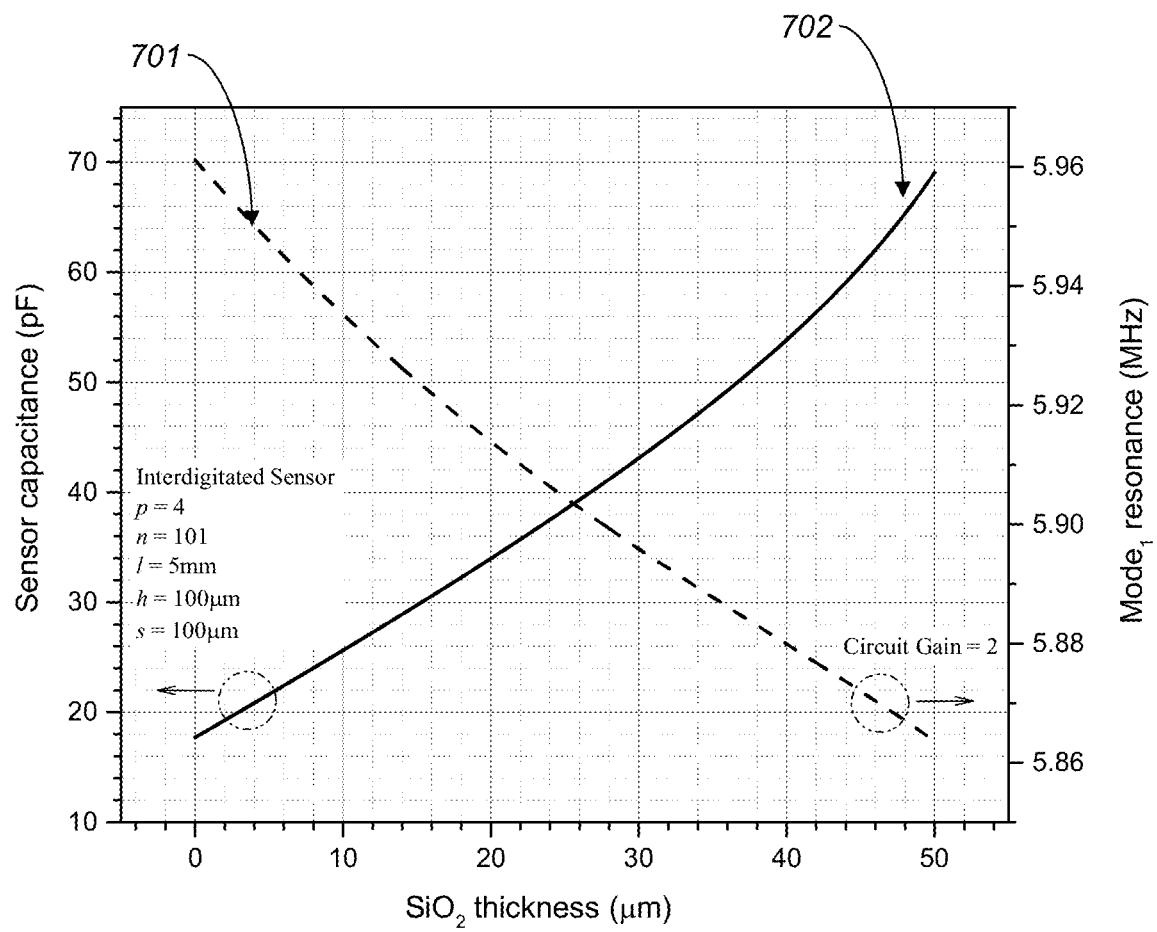
FIG. 7 depicts the calculated frequency shift of the fundamental series resonance (Mode 1) as a function of thickness for $SiO_2$ deposition, in accordance with aspects set forth herein.

FIG. 7 depicts simulated capacitance data as a function of $SiO_2$ deposition thickness up to 50 µm for the interdigitated sensor 600 (FIG. 6), showing a capacitance curve 702 (left y-axis) and a resonance curve 701 (right y-axis). In this example, the parameters of the sensor 600 are (with reference to FIG. 6) as follows:

p=4
n=101
l=5 mm
h=100 µm
s=100 µm

The conformal coating model considered produces the non-plateau shape of the capacitance curve as the model film thickness reaches half of the finger height of the sensor. Also shown is the pulled series resonance frequency of the crystal. Both these parameters show near linear response for capacitance change. In this example, the frequency pulling gain is set to 2. The static capacitance of the crystal in this case is ~6.6 pF and matches to a unity gain of pulling sensitivity. Gain can be selected by either changing the inductance or by changing the varactor bias on the crystal. The linearity over the dynamic range of the process parameter can be improved by adjusting the reverse bias voltage to the two varactors connected in parallel to the crystal. Optionally, such pulling linearization parameters may be stored to be recalled during measurements for a given sensor.

Figure 8:
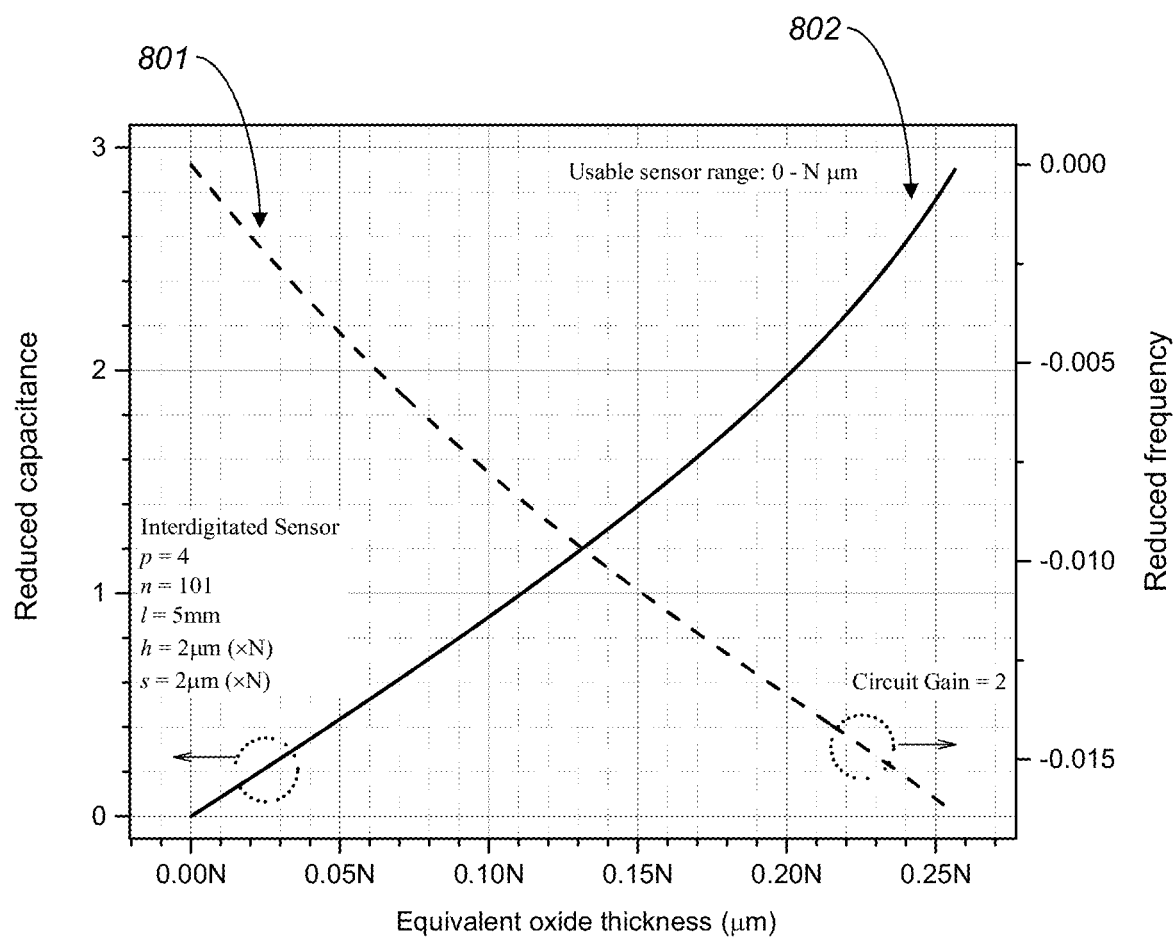
FIG. 8 depicts the reduced frequency shift of the fundamental series resonance as a function of equivalent oxide thickness (EOT), in accordance with aspects set forth herein.

Continuing with modeling results of the sensor 600 of FIG. 6, FIG. 8 depicts the reduced capacitance curve 802 (left y-axis) and the reduced frequency curve 801 (right y-axis), both as a function of dielectric thickness. The reduced frequency/capacitance is defined as the ratio of change in frequency/capacitance to original frequency/capacitance. The x-axis can be used to determine the equivalent oxide thickness for any dielectric material. Here, n is a scaling parameter for sensor design that scales the finger height and spacing. For example, for n=100 and a film of dielectric constant 4, the maximum measurable thickness is ~100 µm. In other words the finger height and spacing needs to be scaled 100 times. Therefore, real time thickness/dielectric values can be either calculated using measured reduced frequency for any sensor or interpolated using stored data for a given sensor. Also, for a material with known dielectric constant the frequency data can be easily converted to deposition rate and thickness.

The following calculation demonstrates the translation of pulling frequency rate measured using the circuit to the rate of change of capacitance induced by a process parameter of interest through any arbitrary sensor. The real and imaginary parts of the sensor arm impedance can be reduced to:

$$Z_{Real} = \frac{C_0^2 C_1^2 L_1^2 R_0 \omega^4 + (C_0 C_1 R_1^2 - 2L_1 C_0 - 2L_1 C_1) R_0 C_0 C_1 \omega^2 + C_1^2 R_1 + C_0^2 R_0 + C_1^2 R_0 + 2 C_0 C_1 R_0}{\left[ C_1^2 L_1^2 \omega^4 + \left( \frac{C_1 R_1^2}{L_1} - 2\frac{C_1}{C_0} - 2 \right) C_1 L_1 \omega^2 + \left( 1 + \frac{C_1}{C_0} \right)^2 \right] C_0^2}$$

$$Z_{Imag} = \frac{\begin{aligned} & C_0^2 C_1^2 C_S L_1^2 L_0 \omega^6 - \\ & \left[ 1 - \frac{C_S L_0 R_1^2}{L_1^2} + 2\frac{C_S L_0}{C_1 L_1}\left(1 + \frac{C_1}{C_0}\right) + \frac{C_S}{C_0} \right] C_0^2 C_1^2 L_1^2 \omega^4 - \\ & \left[ \frac{R_1^2}{L_1}\left(C_1 + \frac{C_1 C_S}{C_0}\right) - 2\left(1 + \frac{C_1}{C_0}\right) - \frac{C_S L_0}{C_1 L_1} - \right. \\ & \left. \left(\frac{C_1 C_S}{C_0^2} + \frac{2 C_S}{C_0}\right)\left(1 + \frac{L_0}{L_1}\right) \right] C_0^2 C_1 L_1 \omega^2 - \\ & C_0^2\left(1 + \frac{C_1}{C_0}\right)\left(1 + \frac{C_1}{C_0} + \frac{C_S}{C_0}\right) \end{aligned}}{\left[ C_1^2 L_1^2 \omega^4 + \left( \frac{C_1 R_1^2}{L_1} - 2\frac{C_1}{C_0} - 2 \right) C_1 L_1 \omega^2 + \left( 1 + \frac{C_1}{C_0} \right)^2 \right] C_0^2 C_S \omega}$$

where, $C_1$, $L_1$, $R_1$ are motional parameters of the electroded crystal.

$C_0$ is the static capacitance of crystal $L_0$, $R_0$ is the inductance and sheet resistance of the compensating inductor $C_S$ is the sensor capacitance, and $\omega$ is the DDS frequency.

By substituting $C_1 L_1 \omega^2 = \Omega$ and $$\frac{C_1}{C_0} = r,$$

the real and imaginary parts of impedance reduce to:

$$Z_{Real} = R_0 \frac{\left\{ \Omega^2 + \left[\frac{C_1 R_1^2}{L_1} - 2(1+r)\right]\Omega + r^2 \frac{R_1}{R_0} + (1+r)^2 \right\}}{\left\{ \Omega^2 + \left[\frac{C_1 R_1^2}{L_1} - 2(1+r)\right]\Omega + (1+r)^2 \right\}}$$

$$Z_{Imag} = \frac{\begin{aligned} & \left(\frac{C_S L_0}{C_1 L_1}\right)\Omega^3 - \left[1 - \frac{C_S L_0 R_1^2}{L_1^2} + 2\frac{C_S L_0}{C_1 L_1}(1+r) + \frac{C_S}{C_0}\right]\Omega^2 - \\ & \left[\frac{R_1^2}{L_1}(C_1 + rC_S) - 2(1+r) - \frac{C_S L_0}{C_1 L_1} - \right. \\ & \left. \left(r^2 \frac{C_S}{C_1} + 2\frac{C_S}{C_0}\right)\left(1 + \frac{L_0}{L_1}\right) \right] \\ & \Omega - (1+r)\left(1 + r + \frac{C_S}{C_0}\right) \end{aligned}}{\left(\left\{\Omega^2 + \left[\frac{C_1 R_1^2}{L_1} - 2(1+r)\right]\Omega + (1+r)^2\right\} C_S \omega\right)}$$

For high quality crystals, $R_1$ is small and as the crystal is not loaded during measurements directly, terms with $R_1$ can be neglected. Further, the inductor selected to compensate the static capacitance satisfies $L_1 C_1 = L_0 C_0 (1+r)$ where, $$\frac{C_1}{C_0} = r,$$

This condition allows us to simplify and solve the above equation for nodes of the impedance spectrum. The solution reduces to three real and three imaginary frequencies due to symmetry.

$$\Omega_{RS} = \left( \frac{\frac{1}{2}\left[\left(\frac{C_0}{C_S} + 2 + r\right) - \sqrt{\left(\frac{C_0}{C_S} - r\right)^2 + 4r}\right]}{\sqrt{\frac{1}{2}\left[\left(\frac{C_0}{C_S} + 2 + r\right) + \sqrt{\left(\frac{C_0}{C_S} - r\right)^2 + 4r}\right]}} \right)$$

Where, r and $C_0$ are crystal parameters, $C_S$ is the capacitance of the sensor connected to the circuit.

Of the three real nodes, the resonance and anti-resonance frequencies of the pulled crystal are given by the first two real solutions. The third real solution corresponds to resonance due to the compensating inductor and is of no interest. However, it needs to be emphasized that crystal parameters need to be selected and the measurable capacitance upper bound be limited to avoid this undesired node from reaching close to and crossing over the series resonance node of interest.

$$\Omega_{RS}(t) = \left(\frac{\omega_{RS}(t)}{\omega_0}\right)^2$$

Here, $\omega_{RS}(t)$ is the real time series resonance frequency and be found using the circuit described in the disclosure. The detected pulled series resonance and its rate of change can be transformed to the total capacitance of the sensor and the rate of change of capacitance as follows.

$$C_S(t) = \frac{C_0[r - \Omega_{RS}(t) + 1]}{r\Omega_{RS}(t) - [\Omega_{RS}(t) - 1]^2}$$

$$\frac{dC_S}{dt} = -C_0 \frac{[r\Omega_{RS}(t) - (\Omega_{RS}(t) - 1)^2] + \{(r - \Omega_{RS}(t) + 1)[r - 2(\Omega_{RS}(t) - 1)]\}}{\{r\Omega_{RS}(t) - [\Omega_{RS}(t) - 1]^2\}^2} \frac{d\Omega_{RS}(t)}{dt}$$

$$\Delta C_S(t_1, N \times 100 \text{ ms}) = C_0 \sum_{j=1}^{N} \left\{ \frac{r - \Omega_{RS}(t_1 + j \times 100 \text{ ms}) + 1}{r\Omega_{RS}(t_1 + j \times 100 \text{ ms}) - [\Omega_{RS}(t_1 + j \times 100 \text{ ms}) - 1]^2} - \frac{r - \Omega_{RS}[t_1 + (j-1) \times 100 \text{ ms}] + 1}{r\Omega_{RS}[t_1 + (j-1) \times 100 \text{ ms}] - [\Omega_{RS}[t_1 + (j-1) \times 100 \text{ ms}] - 1]^2} \right\}$$

The above equations give a generalized platform to measure the rate of change of capacitance induced by any physical quantity of interest; hence, the total capacitance change attributed to the total change in physical quantity during measurement. The last equation shows the integration of capacitance change from time $t_1$ over $N \times 100$ ms using frequency data measured at 100 ms intervals.

The capacitance change of the sensor 600 (FIG. 6) can be related to deposition rate as follows. For full conformal coating, the capacitance measured can be reduced to, $$C_{Sensor}(t) =$$
$$C_S(t) = P(n-1)l\ \varepsilon_0 \varepsilon_{Film}\left[\frac{\varepsilon_P(s - t_{Film})}{\varepsilon_{Film}(s - 2t_{Film}) + 2\varepsilon_P\ t_{Film}} + \frac{t_{Film}}{s}\right] + C_{Fringe}$$

where,
$t_{Film}$: Thickness of coating
$\varepsilon_{Film}$: Dielectric constant of coating
$\varepsilon_P$: Dielectric constant of precursor
$C_{Fringe}$: Capacitance due to fringe field A conjugated dielectric constant for the sensor film combination can be defined as $$\varepsilon_{Sensor}(t) \equiv \frac{C_{Sensor}(t)}{\Gamma},$$

where $\Gamma = P(n-1)l\ \varepsilon_0$ can be termed as the built in gain.

$$\varepsilon_{Sensor}(t) = \frac{C_0[r - \Omega_{RZ}(t) + 1]}{r\Omega_{RZ}(t) - [\Omega_{RZ}(t) - 1]^2}$$

Using the above definition the thin film thickness can be reduced to $$t_{Film}(t) = \frac{h}{2}\left(\frac{1}{2} + K(t)\right), \text{ where}$$

$$K(t) = \frac{\varepsilon_{Sensor}(t)}{\varepsilon_{Film}} \cdot \left\{1 - \sqrt{1 - \frac{\frac{\varepsilon_{Film}}{\varepsilon_{Sensor}(t)}\left(\frac{\varepsilon_{Film} + \varepsilon_P}{\varepsilon_{Film} - \varepsilon_P}\right) +}{\left(\frac{\varepsilon_{Film}}{2\varepsilon_{Sensor}(t)}\right)^2 \left(\frac{\varepsilon_{Film} + 7\varepsilon_P}{\varepsilon_{Film} - \varepsilon_P}\right)}}\right\}$$

Over the full range of the sensor 600, K(t) grows from −0.5 for no film to 0.5 for film thickness matching to finger height, h of the sensor 600. For the circuit described in disclosure, the crystal parameters r, $C_0$, $f_0$ are stored in a non-volatile memory, and F may be a sensor constant that is expected as a user input when connecting a new sensor to the measurement circuit.

Figure 9:
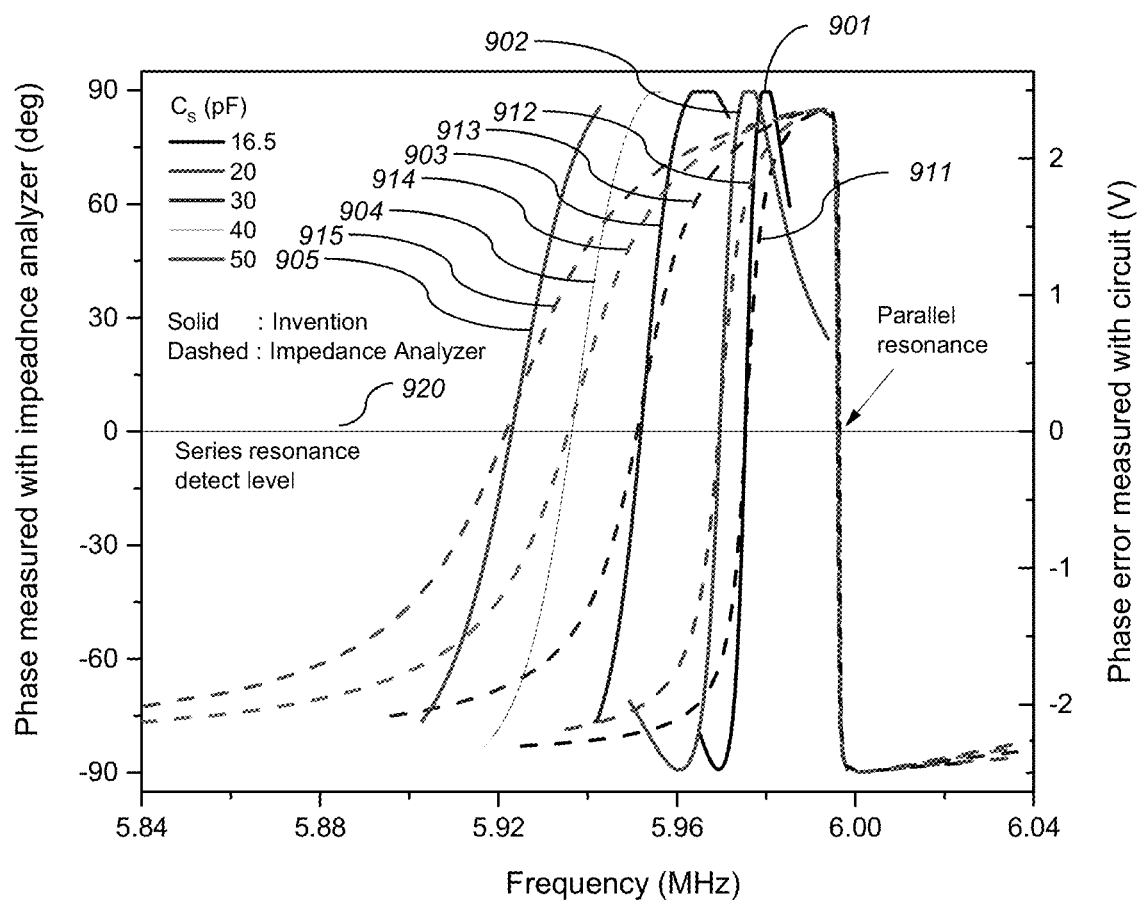
FIG. 9 depicts the phase vs. frequency plot of the sensor arm impedance, in accordance with aspects set forth herein.

FIG. 9 depicts phase error plots for the fundamental mode as a function of sensor capacitance. The solid line plots 901-905 were obtained using a circuit similar to FIG. 2 while the dashed line comparison plots 911-915 of the sensor arm were obtained using an impedance analyzer. Plots 901, 911 depict sensor capacitance $C_S$=16.5 pF; plots 902, 912 depict $C_S$=20 pF; plots 903, 913 depict $C_S$=30 pF; plots 904, 914 depict $C_S$=40 pF; and plots 905, 915 depict $C_S$=50 pF.

The impedance analyzer was compensated for fixture capacitance using OPEN/SHORT configurations before measurements. The phase error of 0V corresponds to series resonance of the pulled spectrum. If the rate of change of reactance (in other words the rate of change of process parameter) needs to be controlled at a set point, the auto balance bridge uses the rate of change of balanced-frequency to generate an analog signal to control the source of a physical parameter. The precision of optional process control depends on the sharpness of phase-frequency slope. As shown in the figure, the sharpness of phase curves shows very small degradation for sensor capacitance change from 16.5 pF to 50 pF. Therefore, the process control will not degrade as much as in the case of a crystal exposed to a process. For example, in the conventional configuration where the crystal is directly exposed to form thick films, acoustically lossy thin films, or high-stress films, noisy measurements and poor controls result due to phase slope degradation.

Figure 10:
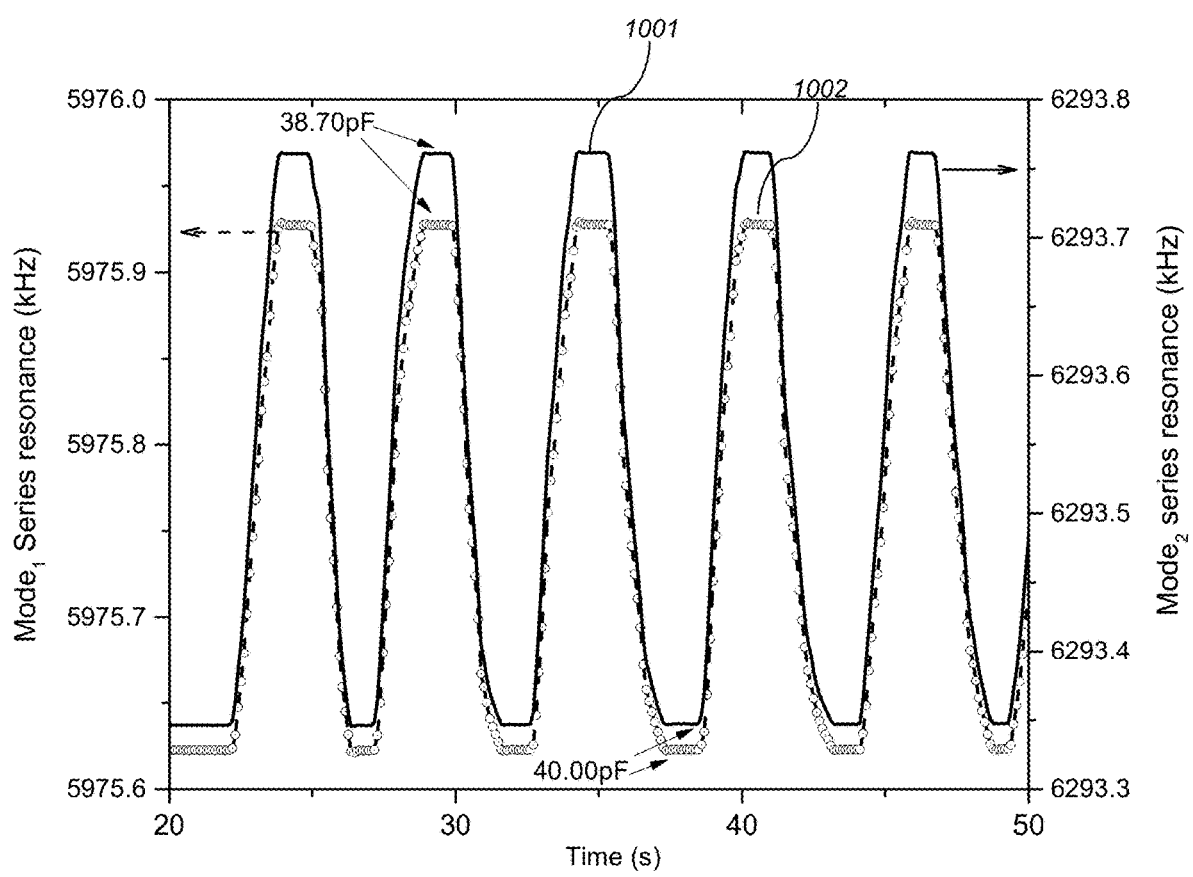
FIG. 10 depicts the response of Mode 1 and Mode 2 series resonance frequencies to modulation of sensor capacitance, in accordance with aspects set forth herein.

FIG. 10 depicts the response of Mode 1, in plot 1001 (right y-axis), and Mode 2, in plot 1002 (left y-axis), series resonance frequencies to modulation of sensor capacitance. Capacitance change for modulation speeds slower than the update rate of phase locked loop can be detected using the techniques described herein. FIG. 10 shows the change in series resonance frequency measured with the current circuit for both the fundamental and the first inharmonic mode as the sensor capacitance is changed between two capacitance values alternately. Both modes were measured simultaneously at 100 ms intervals. A precision capacitance source (model 1422-D, available from General Radio Company of Cambridge, Mass., USA) was used to change the values between two different stops shown in the figure. The sensitivity around 40 pF is −4.2 fF/Hz and the resolution was approximately 1 aF, with rms noise of 200 aF averaged over 10 samples. The noise floor decreased significantly around a sensor capacitance of 10 pF towards 20 aF. Any one of the two modes shown in the figure can be selected to measure the capacitance change of a first sensor exposed to a process compared to the capacitance change of a second sensor used to monitor a reference condition.

Figure 11A:
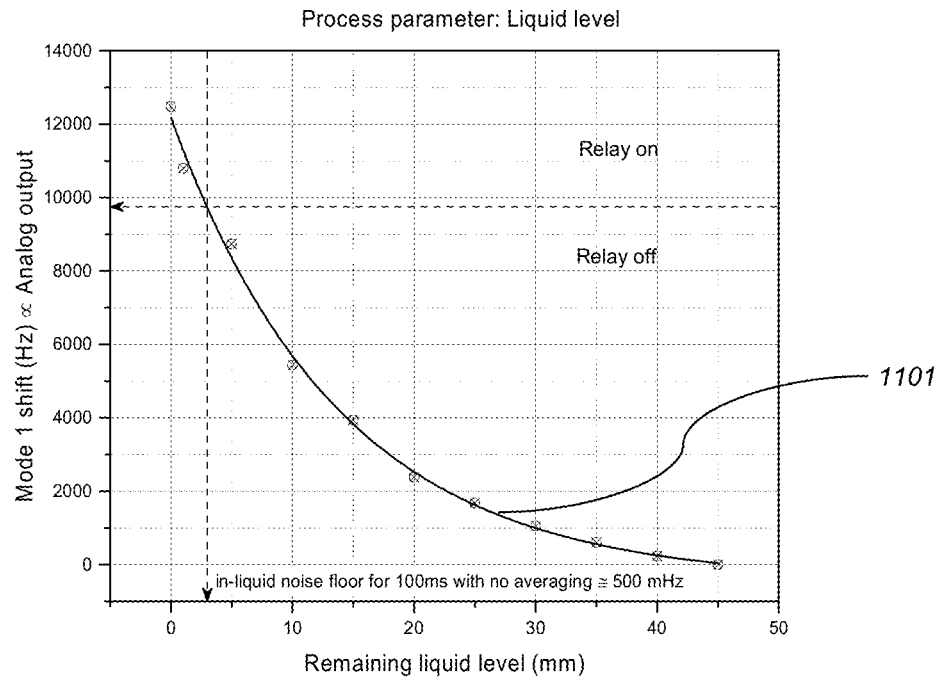
FIGS. 11A and 11B depicts magnitude of frequency pulling measured by the circuit as a function of two different process parameters, in accordance with aspects set forth herein.
Figure 11B:
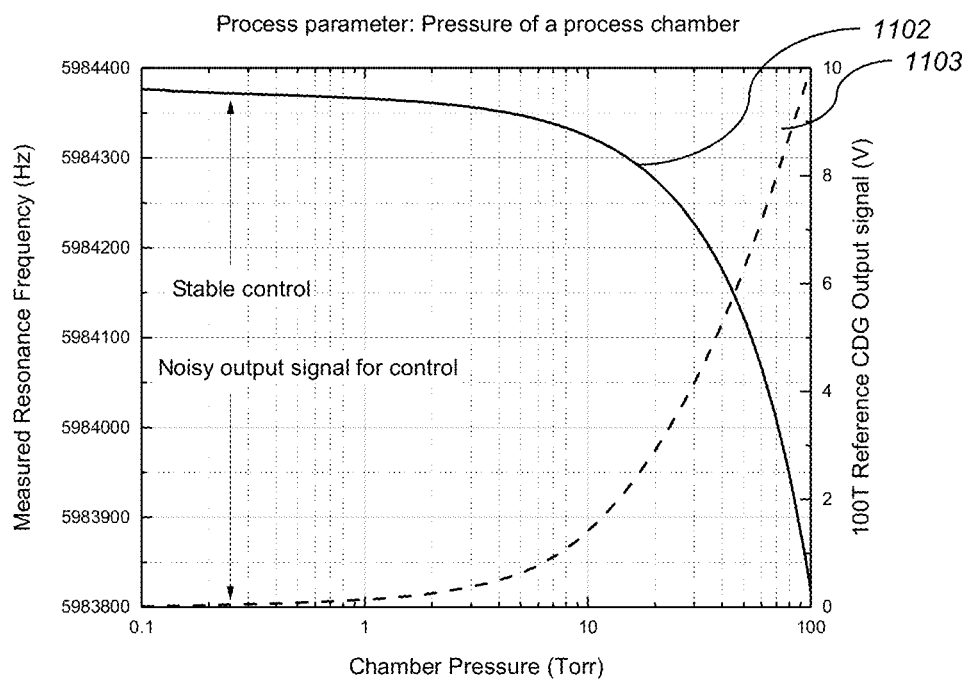

FIGS. 11A and 11B depict magnitude of frequency pulling measured by the circuit as a function of two different process parameters. A sensor configured as a parallel plate capacitor was used for liquid level measurements, and a capacitance diaphragm was used as the sensor to relate to pressure in a process chamber. In FIG. 11A, the process parameter of liquid level is monitored using the present technique, and a mode shift plot 1101 is depicted as a function of remaining liquid level. In FIG. 11B, the process parameter of resonance frequency of chamber pressure is monitored using the present technique, and a stable control plot 1102 is depicted along with a noisy output signal 1103, as a function of chamber pressure.

The two plots in FIGS. 11A and 11B show practical examples where the said circuit was used to demonstrate measurements of liquid level and chamber pressure. A parallel plate capacitor configuration was used for liquid level measurements where the change in liquid level is related to frequency pulling on the crystal. The circuit can be used to trigger an alarm when the liquid level falls below a set point. As evident, the sensitivity of measurement increases with the decreasing liquid level; for example ~1.4 μm/Hz for the dimensions of sensor used in here.

The second plot in FIG. 11B shows the chamber pressure measurements using the reactance circuit. The sensor used in here is a diaphragm from a 100 Torr capacitance diaphragm gauge. The pressure was measured during the pump-down of the chamber. The reference used was another 100-Torr CDG. The converted resolution of pressure measured with the circuit is ~0.5 mTorr over the full scale from 100 Torr to 100 mTorr. The above examples show that the circuit of disclosure can be used to track process parameters at high speed with high resolution by connecting it to judiciously selected sensors.

To the extent that the claims recite the phrase "at least one of" in reference to a plurality of elements, this is intended to mean at least one or more of the listed elements, and is not limited to at least one of each element. For example, "at least one of an element A, element B, and element C," is intended to indicate element A alone, or element B alone, or element C alone, or any combination thereof. "At least one of element A, element B, and element C" is not intended to be limited to at least one of an element A, at least one of an element B, and at least one of an element C.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.), or an embodiment combining software and hardware aspects that may all generally be referred to herein as a "service," "circuit," "circuitry," "module," and/or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code and/or executable instructions embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer (device), partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

What is claimed is:

1. A device for monitoring a process, the device comprising:
    a frequency measurement circuit comprising a crystal not exposed to the process;
    a reactance sensor connected to the frequency measurement circuit and exposed to the process, the reactance sensor being configured to detect a change in a process parameter, wherein the frequency measurement circuit detects the change in the process parameter as a change in the frequency of the crystal due to a change in a reactance of the reactance sensor; and
    an inductor connected in series with the crystal, wherein an inductance of the inductor is matched to compensate the reactance of the reactance sensor to facilitate linearizing a resonance mode of the crystal.

2. The device of claim 1, wherein the frequency measurement circuit comprises a phase lock circuit.

3. The device of claim 1, wherein the frequency measurement circuit measures a fundamental and an inharmonic mode of the crystal.

4. The device of claim 1, further comprising a varactor circuit connected to the crystal, the varactor circuit being configured to improve a linearity of a response to the reactance sensor.

5. The device of claim 1, wherein the frequency measurement circuit comprises a mode-locking circuit to inhibit mode hopping of the crystal.

6. The device of claim 1, wherein the reactance sensor monitors a liquid level.

7. The device of claim 1, wherein the reactance sensor monitors a pressure level.

8. A system comprising:
a reactance sensor disposed in a process chamber, the reactance sensor having a variable reactance responsive to a change in a process parameter;
a measurement device disposed outside the process chamber and comprising frequency measurement circuit, the frequency measurement circuit comprising a crystal and
an inductor connected in series with the crystal and connected to the reactance sensor, wherein an inductance of the inductor is matched to compensate the reactance of the reactance sensor to facilitate linearizing a resonance mode of the crystal, wherein the frequency measurement circuit detects the change in the process parameter as a change in the frequency of the crystal.

9. The system of claim 8, wherein the process parameter is a thickness of a deposited film and the reactance sensor has a variable reactance, the variable reactance being a function of the thickness of the deposited film.

10. The system of claim 8, wherein the process parameter is one of a vibration or a rotation, and the reactance sensor has a variable reactance, the variable reactance being a function of the vibration or the rotation.

11. The system of claim 8, wherein the frequency measurement circuit comprises a phase lock circuit.

12. The system of claim 8, wherein the frequency measurement circuit measures a fundamental and an inharmonic mode of the crystal.

13. The system of claim 8, further comprising a varactor circuit connected to the crystal, the varactor circuit being configured to improve a linearity of a response to the reactance sensor.

14. The system of claim 8, wherein the frequency measurement circuit comprises a mode-locking circuit to inhibit mode hopping of the crystal.

15. A method for monitoring a process, the method comprising:
monitoring a reactance of a process within a process chamber with a reactance sensor, the reactance sensor comprising a variable reactance responsive to a change in a process parameter;
connecting a crystal disposed outside the process chamber to the reactance sensor;
connecting an inductor in series with the crystal, wherein an inductance of the inductor is matched to compensate the reactance of the reactance sensor to facilitate linearizing a resonance mode of the crystal;
detecting a change in the frequency of the crystal; and
using the detected change in the frequency of the crystal to determine the process parameter.

16. The method of claim 15, further comprising measuring a fundamental and an inharmonic mode of the crystal.

17. The method of claim 15, further comprising measuring the change in the frequency of the crystal with a phase lock circuit.

* * * * *

UNITED STATES PATENT AND TRADEMARK OFFICE
CERTIFICATE OF CORRECTION

| | | |
|---|---|---|
| PATENT NO. | : 11,175,323 B2 | Page 1 of 1 |
| APPLICATION NO. | : 15/461959 | |
| DATED | : November 16, 2021 | |
| INVENTOR(S) | : Mohamed B. Rinzan | |

It is certified that error appears in the above-identified patent and that said Letters Patent is hereby corrected as shown below:

On the Title Page

Item (60), Add:
--Related U.S. Application Data
Provisional Application No. 62/310,403 filed on Mar. 18, 2016--

Signed and Sealed this
Third Day of May, 2022

*Katherine Kelly Vidal*

Katherine Kelly Vidal
*Director of the United States Patent and Trademark Office*